(12) United States Patent
Cheng et al.

(10) Patent No.: US 9,058,858 B2
(45) Date of Patent: Jun. 16, 2015

(54) METHOD AND APPARATUS FOR DUAL RAIL SRAM LEVEL SHIFTER WITH LATCHING

(75) Inventors: Hong-Chen Cheng, Hsinchu (TW); Chia-En Huang, Xinfeng Township (TW); Chih-Chieh Chiu, Toufen Township (TW); Jung-Ping Yang, Jui-bei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 691 days.

(21) Appl. No.: 13/303,231

(22) Filed: Nov. 23, 2011

(65) Prior Publication Data

US 2013/0128655 A1 May 23, 2013

(51) Int. Cl.
*G11C 11/418* (2006.01)
*G11C 8/10* (2006.01)
*G11C 11/413* (2006.01)

(52) U.S. Cl.
CPC .............. *G11C 8/10* (2013.01); *G11C 11/418* (2013.01); *G11C 11/413* (2013.01)

(58) Field of Classification Search
CPC . G11C 11/419; H01L 27/11; H01L 27/10897

USPC .................. 365/189.11, 185.23, 154, 189.06, 365/230.06; 327/333
See application file for complete search history.

(56) References Cited

U.S. PATENT DOCUMENTS

| 7,710,796 B2* | 5/2010 | Cottier et al. ............. 365/189.11 |
| 8,363,507 B2* | 1/2013 | Cho .......................... 365/230.06 |
| 2007/0195605 A1* | 8/2007 | Garofalo et al. ......... 365/185.23 |
| 2011/0194362 A1 | 8/2011 | Lu |
| 2011/0199837 A1* | 8/2011 | Reohr et al. ............. 365/189.06 |

* cited by examiner

*Primary Examiner* — Richard Elms
*Assistant Examiner* — Ajay Ojha
(74) *Attorney, Agent, or Firm* — Duane Morris LLP

(57) ABSTRACT

An apparatus includes a level shifter and a switching circuit. The level shifter includes an input, a first output, and second output having a logic value complementary to a logic value of the first output. The switching circuit includes a data input, a feedback input coupled to the second output of the level shifter, and an output coupled to the input of the level shifter. The switching circuit is configured to selectively latch, based on a select signal, a logic state of the level shifter at the second output.

19 Claims, 6 Drawing Sheets

METHOD AND APPARATUS FOR DUAL RAIL SRAM LEVEL SHIFTER WITH LATCHING

BACKGROUND

Static random access memory (SRAM) is a type of semiconductor memory that stores data in the form of bits using bistable circuitry without the need for refreshing. An SRAM cell may be referred to as a bit cell because it stores a bit of information. Each bit cell in a memory array typically includes connections to a power supply voltage and to a reference voltage. Bit lines are used for accessing a bit cell, with a word line controlling connections to the bit lines. The lowest $V_{DD}$ voltage (positive power supply voltage) at which an SRAM bit cell may function is referred to as $Vcc_{min}$. One issue as CMOS technology scales down is the choice of an appropriate power supply level. Increasing the power supply level may yield faster performance and improved reliability for memory cells and word line drivers that interface with memory cells. On the other hand, increasing the power supply level may increase leakage for other components.

One approach that has been used as SRAM area scales down is referred to as dual rail SRAM, in which dual power rails are provided. A power supply voltage $V_{DD}$ is provided for certain components (e.g., components preceding and including a level shifter in a processing flow), and another power supply voltage $CV_{DD}$ (which stands for "cell $V_{DD}$") greater than $V_{DD}$ is provided for memory cells and word line drivers. A level shifter may be included at any stage before word line drivers to shift the voltage level from $V_{DD}$ to $CV_{DD}$. With dual rail SRAM, faster performance and improved reliability for memory cells and word line drivers may be achieved without unduly increasing leakage for other components.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled", "connected" and "interconnected," refer to a relationship wherein structures communicate with one another either directly or indirectly through intervening structures unless expressly described otherwise.

Figure 1:
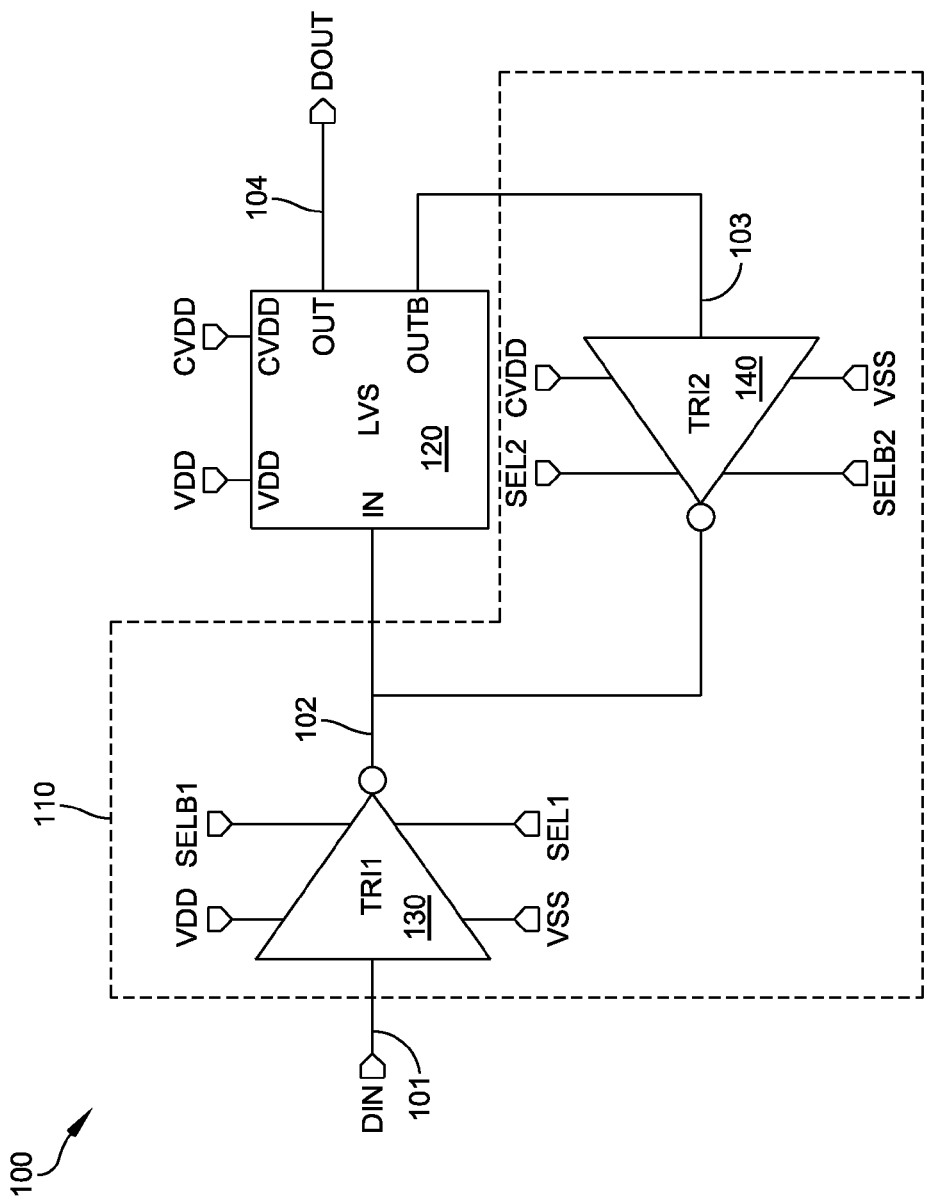
FIG. 1 is a block diagram of an apparatus in accordance with some embodiments.

FIG. 1 is a block diagram of an apparatus 100 in accordance with some embodiments. A switching circuit 110 receives an input signal DIN at node 101 and determines a signal to be provided at an input to a level shifter (LVS) 120. Level shifter 120 is configured to provide, via an output OUT, a signal DOUT having voltage $CV_{DD}$ at an output node 104 when the input (marked "IN" in FIG. 1) to the level shifter has voltage $V_{DD}$. In other words, level shifter shifts voltage levels from $V_{DD}$ to $CV_{DD}$. $CV_{DD}$ is higher than $V_{DD}$ to support dual rail SRAM as described above. If the input to the level shifter is at ground voltage (e.g., $V_{SS}$), then the ground is provided at output node 104.

In some instances, the input to level shifter 120 may be based on DIN; in other instances, a logic state of the level shifter may be latched by a feedback path. An output OUTB of the level shifter 120, which is the logical complement of output OUT, may be routed back to the switching circuit 110, which may switch a signal that is based on OUTB back to the input IN of the level shifter. The switching circuit 110 may be controlled by control signals to determine whether a path from DIN to the input IN of level shifter 120 is enabled or whether the feedback path is enabled.

The switching circuit 110 may be implemented by a pair of tri-state inverters. A first tri-state inverter 130 (marked TRI1 in FIG. 1) having a power supply connection $V_{DD}$ and a ground connection $V_{SS}$ is configured to selectively invert DIN, based on a signal SEL1 and a signal SELB1 that is the logical complement of SEL1, to provide a logical complement (logical inversion) of DIN at node 102. The selective inversion is controlled as follows. If SEL1 has a logical high value and SELB1 has a logical low value, tri-state inverter 130 inverts signal 101. If SEL1 has a logical low value and SELB1 has a logical high value, the output of tri-state inverter 130 is electrically floating (high impedance), so that the tri-state inverter is disconnected from the input to level shifter 120.

A second tri-state inverter 140 (marked TRI2 in FIG. 1) having a power supply connection $CV_{DD}$ and a ground connection $V_{SS}$ operates in similar fashion. If SEL2 has a logical high value and SELB2 has a logical low value, tri-state inverter 140 inverts the signal received at its input node 103. If SEL2 has a logical low value and SELB2 has a logical high value, the output of tri-state inverter 140 is electrically floating, so that the output of that tri-state inverter is disconnected from the input to level shifter 120.

Thus, by employing tri-state logic with tri-state inverters 130 and 140, switching circuit 110 may switch the input to level shifter 120 as being based on DIN or as being based on based on output OUTB of the level shifter. If DIN is low, tri-state inverter 130 selectively provides a high signal having voltage $V_{DD}$ as an input to level shifter 120, which shifts the voltage to a higher voltage $CV_{DD}$ at its output OUT. Because OUTB is the logical complement of signal OUT and tri-state inverter 140 inverts OUTB, tri-state inverter 140 selectively provides to input IN of the level shifter 120 the same value as output OUT of the level shifter. Thus, the feedback path including tri-state inverter 140 selectively latches the logic state of the level shifter as represented by the feedback signal at node 103.

Embodiments of the present disclosure reduce the timing delay associated with level shifting. For example, in a traditional level shifter implementation for dual rail SRAM, a level shifter would be placed before a latch in a processing chain. By placing a level shifter at the front of a processing chain and then latching a value stored at the level shifter, such a traditional implementation increased the hold time for accessing a memory, e.g., by up to two gate delays (delay of the level shifter). In contrast, with apparatus 100, the delay between the availability of output OUT of level shifter 120 and when that signal is used is reduced because level shifter 120 is not at the front of the processing chain; rather, tri-state inverter 130 is at the front of the processing chain, coupled to DIN.

Figure 2:
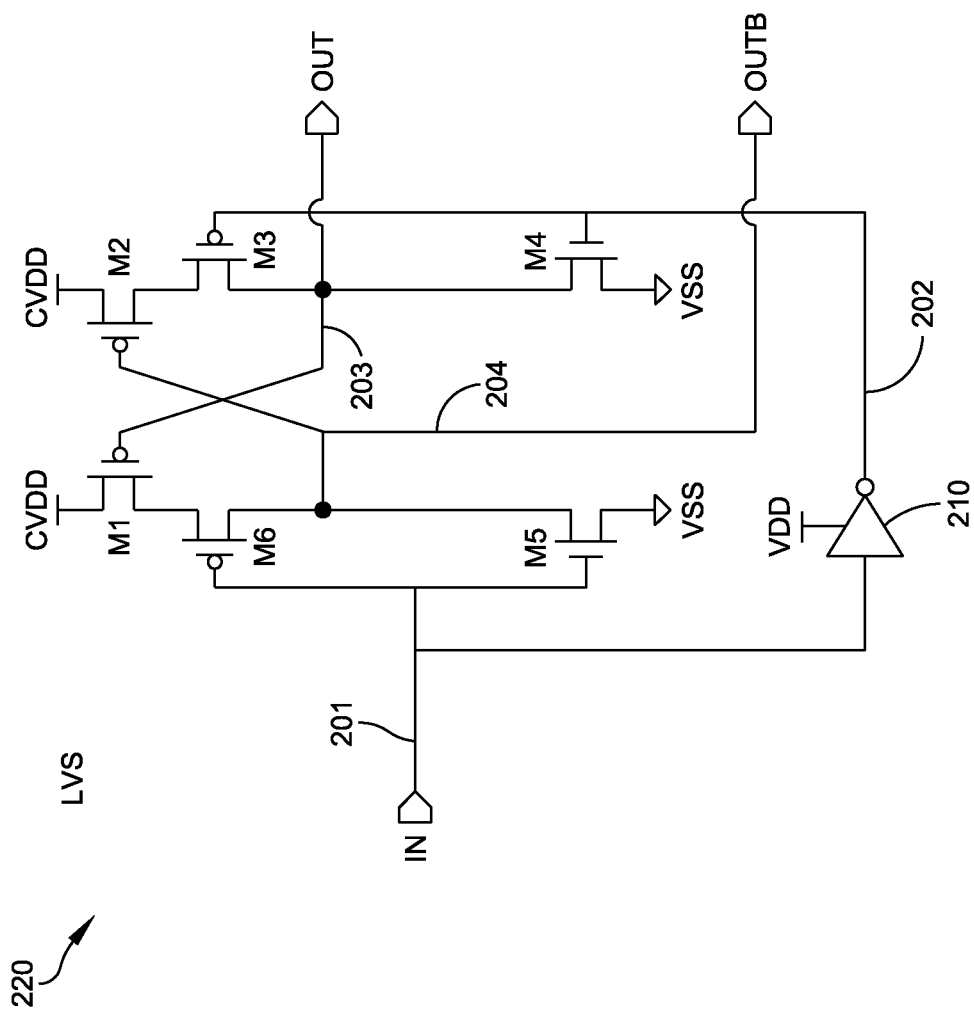
FIG. 2 is a block diagram of a level shifter in accordance with some embodiments.

FIG. 2 is a block diagram of a level shifter in accordance with some embodiments. Level shifter 220 of FIG. 2 may be an example implementation of level shifter 120. Level shifter 220 includes PMOS transistors M1, M2, M3, and M6; NMOS transistors M4 and M5; and inverter 210. The operation of level shifter 220 may be understood by considering the cases of high and low input voltages at node 201.

When the input signal IN at node 201 is high ($V_{DD}$), NMOS transistor M5 is "on" (conducting between source and drain terminals, i.e., acting as a closed switch), and the voltage at node 204 (and thus at output OUTB) is pulled low due to the path to ground provided by M5, thus turning on PMOS transistor M2. Inverter 210, which is powered by $V_{DD}$, yields low voltage at node 202, which turns on PMOS transistor M3. Because M2 is also on as described above, the voltage at node 203 (and thus at output OUT) is pulled high to $CV_{DD}$. Thus, an input voltage $V_{DD}$ has been shifted to an output voltage $CV_{DD}$ at OUT in this case.

When the input signal IN at node 201 is low, PMOS transistor M6 is on. Inverter 210 provides high voltage ($V_{DD}$) at node 202, turning on NMOS transistor M4, and the voltage at node 203 (and thus at output OUT) is pulled low due to the path to ground provided by M4. Consequently, PMOS transistor M1 turns on, and because M6 is also on as described above, the voltage at node 204 (and thus at output OUTB) is pulled high to $CV_{DD}$. Thus, a low input voltage yields a low output voltage at OUT in this case.

Figure 3:
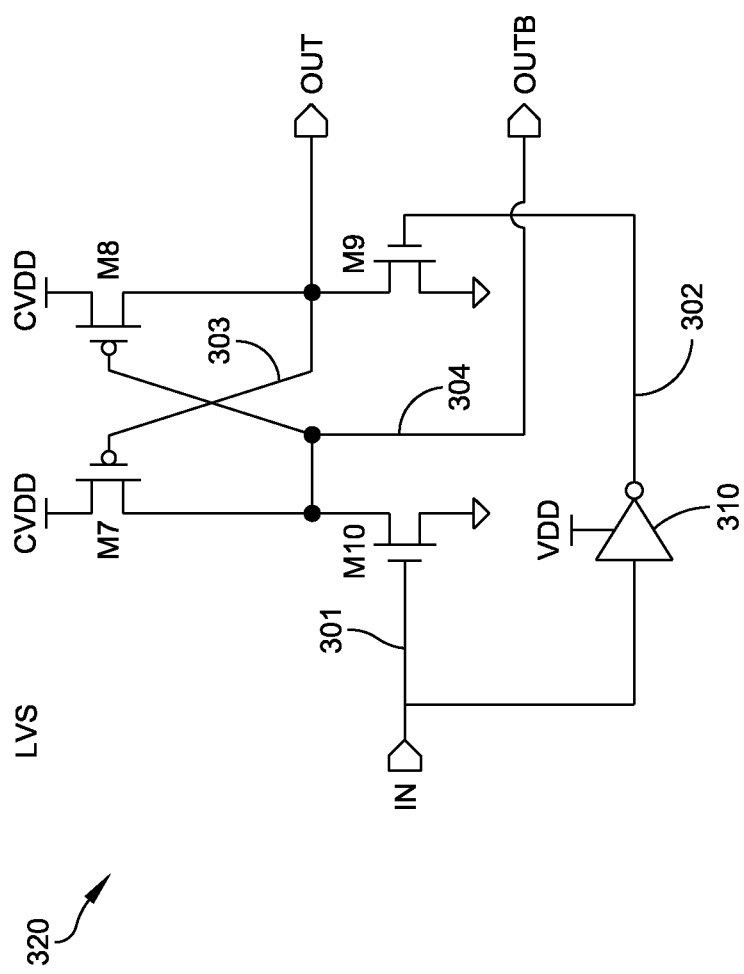
FIG. 3 is a block diagram of another level shifter in accordance with some embodiments.

FIG. 3 is a block diagram of another level shifter 320 in accordance with some embodiments. Level shifter 320 may be an example implementation of level shifter 120 of FIG. 1. When the input signal IN at node 301 is high ($V_{DD}$), NMOS transistor M10 is on. Inverter 310 provides low voltage at node 302, which turns off NMOS transistor M9. The voltage at node 304 (and thus at output OUTB) becomes low due to the path to ground provided by M10. PMOS transistor M8 is turned on, and the voltage at node 303 (and thus at output OUT) becomes $CV_{DD}$.

When the input signal IN at node 301 is low, NMOS transistor M10 is off. Inverter 310 yields high voltage ($V_{DD}$) at node 302, which turns on M9. The voltage at node 303 (and thus at output OUT) becomes low due to the path to ground provided by M9. Consequently, PMOS transistor M7 turns on, and the voltage at node 304 (and thus at output OUTB) becomes $CV_{DD}$.

Figure 4:
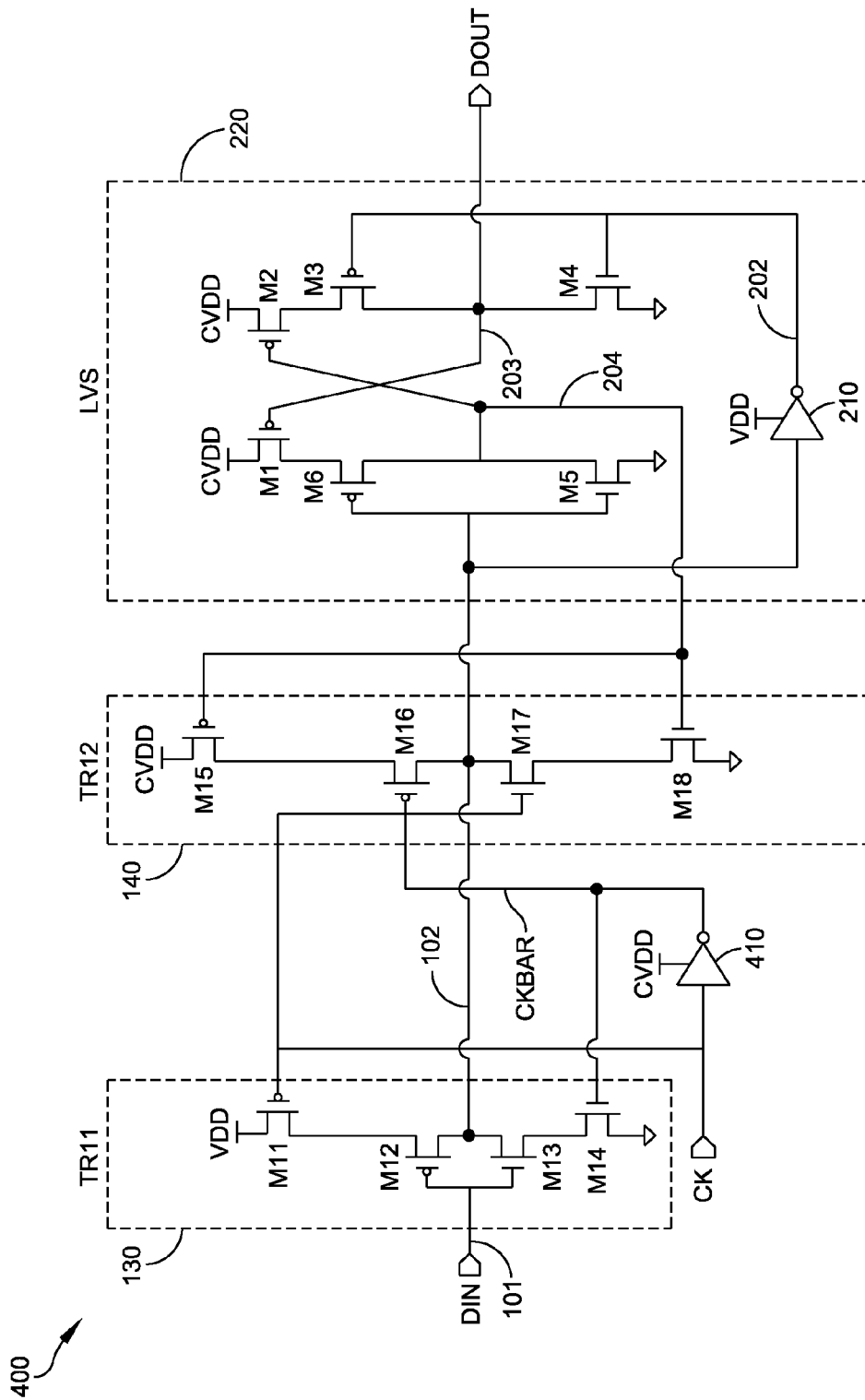
FIG. 4 is a schematic diagram of a circuit in accordance with some embodiments.

FIG. 4 is a schematic diagram of a circuit 400 in accordance with some embodiments. FIG. 4 shows an example implementation of tri-state inverters 130 and 140 of FIG. 1 and shows an example implementation using level shifter 220. Level shifter 320 or another suitable level shifter with similar input-output characteristics may be used instead of level shifter 220 in circuit 400. The tri-state inverters 130 and 140 are controlled by a signal CK and its complement signal CKBAR, which may be provided at the output of an inverter 410 that inverts CK. In one example, CK may be asserted at the rising edges of a clock signal (not shown).

When CK is low, inverter 410 yields a high value of $CV_{DD}$ for CKBAR. PMOS transistor M11 and NMOS transistor M14 are turned on. Transistors M12 and M13 serve as a CMOS inverter, and the output of tri-state inverter 130 at node 102 is the logical complement of DIN (ground if DIN is high, and $V_{DD}$ if DIN is low). Node 102 is the input to level shifter 220, so a voltage $V_{DD}$ at node 102 is shifted to a higher voltage $CV_{DD}$ at DOUT. Because CK is low and CKBAR is high, PMOS transistor M16 and NMOS transistor M17 are off, so tri-state inverter 140 does not invert in the feedback path in this case.

When CK is high, inverter 410 yields a low value for CKBAR. PMOS transistor M11 and NMOS transistor M14 are turned off, and TRI1 does not invert DIN in this case. Transistors M16 and M17 are on, and transistors M15 and M18 serve as a CMOS inverter to invert the signal at node 204 to provide an output of tri-state inverter 140 at node 102, which is the input to level shifter 220. Because tri-state inverter 140 is powered by $CV_{DD}$ rather than $V_{DD}$, a low value at node 204 (the OUTB output of level shifter 220 in FIG. 2) is inverted to a value of $CV_{DD}$, thus latching the level shifter's logic state. Similarly, if node 203 (corresponding to the OUT output of level shifter 220 in FIG. 2) is low, then node 204 is high, and tri-state inverter 140 outputs a low value that is latched in to store the level shifter's logic state.

Figure 5:
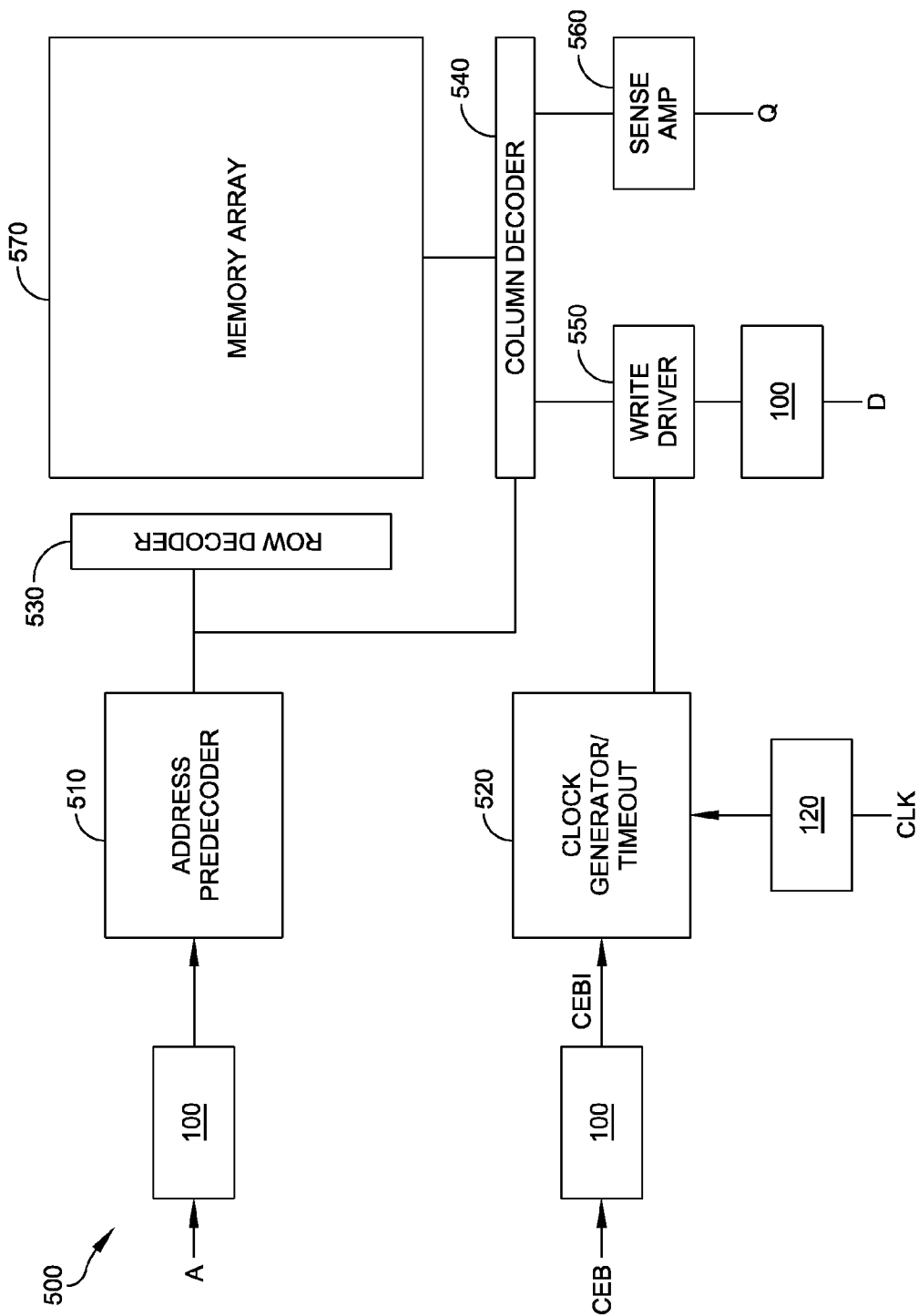
FIG. 5 is a block diagram of a memory apparatus in accordance with some embodiments.

FIG. 5 is a block diagram of a memory apparatus 500 in accordance with some embodiments. FIG. 5 shows a dual rail implementation for accessing a memory array 570, which may be a static random access memory (SRAM) array. Memory array 570 includes multiple SRAM bit cells arranged in rows and columns, with word lines and bit lines (not shown) provided to access respective rows and columns. A row decoder 530 and a column decoder 540 provide an interface to a particular row and column of the array 570. An address predecoder 510 is coupled to the row and column decoders 530, 540 and may be configured to reset word lines. The predecoder 510 may partition an input address into a row address and a column address. In a group of row addresses, the input address may be separated into multiple (e.g., two or three) subgroups to decode the decode buses for a word line driver array. For example, a word line may be activated in a 512 word line driver array by decode buses WDC<7:0>, WDB<7:0> and WDA<7:0>. In such an example, the predecoder decodes input addresses to buses WDC, WDB and WDA for the word line driver array. A write driver 550 is coupled to the column decoder 540 and is configured to discharge a bit line, during a write operation, from a precharged level to below a write margin of the bit cells. A sense amplifier 560 discerns which bit cell in a pair of bit lines associated with a bit cell is higher and which bit cell is lower, thereby determining the logic value stored in the bit cell. A clock generator/timeout module 520 may provide timing information to write driver 550.

Apparatus 100 as in FIG. 1 may be used as shown in FIG. 5 to support dual rail SRAM functionality. Specifically, level shifting with latching may be provided by apparatus 100 at inputs to each of the address predecoder 510, clock generator 520, and write driver 550. For example, a chip enable signal CEB may be provided to apparatus 100, with a level shifted and inverted version of that signal provided as CEBI as a power supply for clock generator 520. A level shifter 120 may also shift a level of a clock signal CLK to provide an input to the clock generator 520. The clock signal CLK is different from other signals that are synchronous and that are latched.

Figure 6:
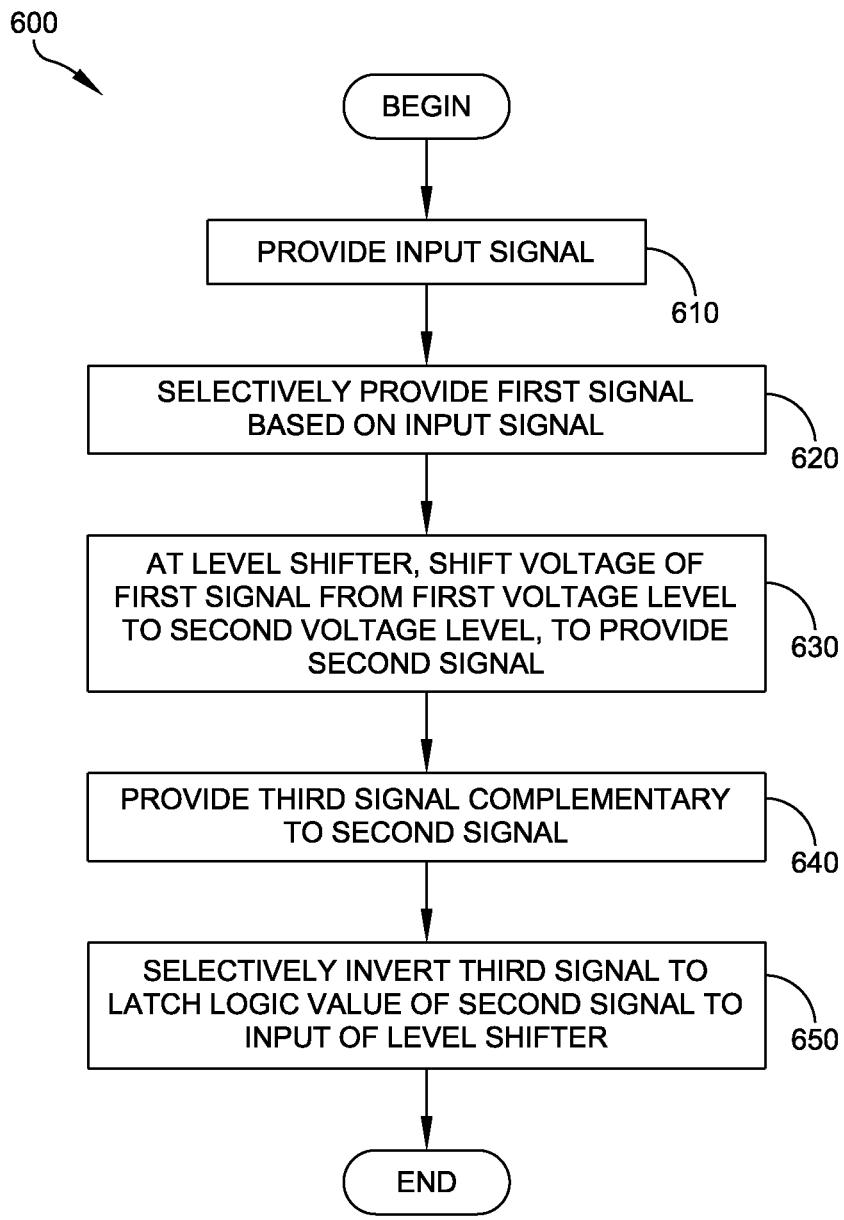
FIG. 6 is a flow diagram of a process in accordance with some embodiments.

FIG. 6 is a flow diagram of a process in accordance with some embodiments. After process 600 begins, an input signal (e.g., signal DIN in FIG. 1) is provided (610). A first signal is selectively provided (620) based on a select signal. The first signal may be the input signal or the complement of the input signal. For example, using tri-state inverter 130, the first signal may be a complement of signal DIN and may be provided at node 102. At a level shifter (e.g., level shifter 120), a voltage of the first signal may be shifted (630) from a first voltage level (e.g., $V_{DD}$) to a second voltage level (e.g., $CV_{DD}$), to provide a second signal (e.g., OUT in FIG. 1). A third signal (e.g., OUTB in FIG. 1) having a logic value complementary to a logic value of the second signal is provided (640). The third signal may be selectively inverted (650), based on the select signal, to latch the logic value of the second signal to an input of the level shifter.

In some embodiments, an apparatus (e.g., apparatus 100) includes a level shifter (e.g., level shifter 120) and a switching circuit (e.g., switching circuit 110). The level shifter has an input (e.g., input IN FIG. 1), a first output (e.g., OUT), and a second output (e.g., OUTB) having a logic value complementary to a logic value of the first output. The switching circuit includes a data input, a feedback input coupled to the second output of the level shifter, and an output coupled to the input of the level shifter. The switching circuit is configured to selectively latch, based on a select signal (e.g., signal CK in FIG. 4), a logic state of the level shifter at the second output.

In some embodiments, an apparatus includes a first tri-state inverter (e.g., tri-state inverter 130), a second tri-state inverter (e.g., tri-state inverter 140), and a level shifter (e.g., level shifter 120). The first tri-state inverter is configured to invert a data input, to provide a signal at an output node of the first tri-state inverter, when a select input has a first logic value. The level shifter includes an input coupled to the output node of the first tri-state inverter. The level shifter further includes a first output and a second output having a logic value complementary to a logic value of the first output. The second tri-state inverter has an output coupled to the input of the level shifter. The second tri-state inverter is configured to invert the second output of the level shifter when the select input has a second logic value complementary to the first logic value.

In some embodiments, an input signal is provided. A first signal is selectively provided based on a select signal. The first signal may be the input signal or the complement of the input signal. A voltage of the first signal may be shifted from a first voltage level to a second voltage level, to provide a second signal. A third signal having a logic value complementary to a logic value of the second signal is provided. The third signal may be selectively inverted, based on the select signal, to latch a logic state associated with the shifting.

Although examples are illustrated and described herein, embodiments are nevertheless not limited to the details shown, since various modifications and structural changes may be made therein by those of ordinary skill within the scope and range of equivalents of the claims.

What is claimed is:

1. An apparatus comprising:
    a level shifter having an input, a first output, and a second output having a logic value complementary to a logic value of the first output; and
    a switching circuit comprising:
        a data input,
        a feedback input coupled to the second output of the level shifter,
        an output coupled to the input of the level shifter, and
        a first tri-state inverter configured to provide a complement of the data input at the output of the switching circuit in response to a select signal;
    wherein the switching circuit is configured to selectively latch, based on the select signal, a logic state of the level shifter at the second output.

2. The apparatus of claim 1, wherein the switching circuit further includes a second tri-state inverter coupled in a feedback path between the second output of the level shifter and the input of the level shifter, and the second tri-state inverter is responsive to the select signal.

3. The apparatus of claim 2, wherein the first tri-state inverter includes:
    a first CMOS inverter including an input coupled to the data input of the switching circuit, and an output coupled to the output of the switching circuit; and
    a first pair of selection transistors configured to selectively disconnect the first CMOS inverter from a power supply node and from a ground node based on the select signal;
    wherein the second tri-state inverter includes:
    a second CMOS inverter including an input coupled to the second output of the level shifter, and an output coupled to the output of the switching circuit; and
    a second pair of selection transistors configured to selectively disconnect the second CMOS inverter from the power supply node and from the ground node based on the select signal.

4. The apparatus of claim 3, wherein the first pair of selection transistors is configured to disconnect the first CMOS inverter from the power supply and ground nodes when the select signal has a first logic value, and the second pair of selection transistors is configured to disconnect the second CMOS inverter from the power supply and ground nodes when the select signal has a second logic value complementary to the first logic value.

5. The apparatus of claim 1, wherein the level shifter includes:
    a first inverter powered by a first power supply node having a first voltage level, the first inverter having an input coupled to the input of the level shifter;
    a second inverter including:
        an input coupled to the input of the level shifter,
        an output coupled to the second output of the level shifter,
        a first power lead, and
        a second power lead coupled to a ground node;
    a third inverter including:
        an input coupled to an output of the first inverter,
        an output coupled to the first output of the level shifter,
        a first power lead, and
        a second power lead coupled to the ground node;
    a first PMOS transistor including a source coupled to a second power supply node having a second voltage level higher than the first voltage level, a gate coupled to the output of the third inverter, and a drain coupled to the first power lead of the second inverter; and
    a second PMOS transistor including a source coupled to the second power supply node, a gate coupled to the output of the second inverter, and a drain coupled to the first power lead of the third inverter.

6. The apparatus of claim 1, wherein the level shifter includes:
    an inverter coupled to a first power supply node having the first voltage level, the inverter having an input coupled to the input of the level shifter;
    a first PMOS transistor including a source coupled to a second power supply node having the second voltage level, and a gate coupled to the first output of the level shifter;
    a first NMOS transistor including a drain coupled to a drain of the first PMOS transistor, a gate coupled to the input of the level shifter, and a source coupled to a ground node;
    a second PMOS transistor including a source coupled to the second power supply node, and a gate coupled to a drain of the first PMOS transistor and to the second output of the level shifter; and a second NMOS transistor including a drain coupled to a drain of the second PMOS transistor, a gate coupled to the output of the inverter, and a source coupled to the ground node.

7. The apparatus of claim 1, wherein the second voltage level is higher than the first voltage level.

8. The apparatus of claim 1, further comprising:
a clock generator including an input coupled to the first output of the level shifter, the clock generator configured to generate a clock signal;
a plurality of bit lines coupled to respective columns of an array of static random access memory (SRAM) bit cells; and
a write driver configured to discharge one of the bit lines, based on the clock signal, from a precharge level to below a write margin of the SRAM bit cells.

9. The apparatus of claim 1, further comprising:
a plurality of bit lines coupled to respective columns of an array of static random access memory (SRAM) bit cells; and
a write driver including an input coupled to the first output of the level shifter, the write driver configured to discharge one of the bit lines from a precharge level to below a write margin of the SRAM bit cells.

10. The apparatus of claim 1, further comprising:
a word line coupled to a row of static random access memory (SRAM) bit cells; and
an address predecoder including an input coupled to the first output of the level shifter, the address predecoder configured to reset the word line.

11. A method comprising:
providing an input signal;
selectively providing a first signal based on a select signal, wherein the first signal is one of the input signal and a complement of the input signal;
at a level shifter, shifting a voltage of the first signal from a first voltage level to a second voltage level, to provide a second signal;
providing a third signal having a logic value complementary to a logic value of the second signal; and
selectively inverting the third signal, using an inverter having the third signal as a data input and the select signal as a control input, to latch the logic value of the second signal to an input of the level shifter.

12. The method of claim 11, wherein the first signal is the complement of the input signal, and the first signal is provided by a tri-state inverter.

13. The method of claim 11, wherein the input signal is inverted to provide the first signal if the select signal has a first logic value, and the logic state is latched if the select signal has a second logic value complementary to the first logic value.

14. The method of claim 11, wherein the second voltage level is higher than the first voltage level.

15. The method of claim 11, further comprising:
generating a clock signal based on power supplied by the second signal; and
discharging, based on the clock signal, a bit line of an array of static random access memory (SRAM) cells from a precharge level to below a write margin of the SRAM bit cells.

16. The method of claim 11, further comprising:
discharging, based on power supplied by the second signal, a bit line of an array of static random access memory (SRAM) cells from a precharge level to below a write margin of the SRAM bit cells.

17. The method of claim 11, further comprising resetting, based on power supplied by the second signal, a word line coupled to a row of static random access memory (SRAM) bit cells.

18. An apparatus comprising:
a first tri-state inverter configured to invert a data input, to provide a signal at an output node of the first tri-state inverter, when a select input has a first logic value;
a level shifter including an input coupled to the output node of the first tri-state inverter, the level shifter further including a first output and a second output having a logic value complementary to a logic value of the first output; and
a second tri-state inverter having an output coupled to the input of the level shifter, the second tri-state inverter configured to invert the second output of the level shifter when the select input has a second logic value complementary to the first logic value.

19. The apparatus of claim 18, wherein the level shifter includes:
a first inverter powered by a first power supply node having a first voltage level, the first inverter having an input coupled to the input of the level shifter;
a second inverter including:
an input coupled to the input of the level shifter,
an output coupled to the second output of the level shifter,
a first power lead, and
a second power lead coupled to a ground node;
a third inverter including:
an input coupled to an output of the first inverter,
an output coupled to the first output of the level shifter,
a first power lead, and
a second power lead coupled to the ground node;
a first PMOS transistor including a source coupled to a second power supply node having a second voltage level higher than the first voltage level, a gate coupled to the output of the third inverter, and a drain coupled to the first power lead of the second inverter; and
a second PMOS transistor including a source coupled to the second power supply node, a gate coupled to the output of the second inverter, and a drain coupled to the first power lead of the third inverter.

* * * * *